United States Patent [19]
Sano et al.

[11] Patent Number: 5,952,714
[45] Date of Patent: Sep. 14, 1999

[54] SOLID-STATE IMAGE SENSING APPARATUS AND MANUFACTURING METHOD THEREOF

[75] Inventors: Yoshikazu Sano, Osaka; Sumio Terakawa, Ibaraki; Eiichi Tsujii, Jouyou; Masaji Asaumi; Yoshikazu Chatani, both of Kyoto, all of Japan

[73] Assignee: Matsushita Electronics Corporation, Osaka, Japan

[21] Appl. No.: 08/809,845

[22] PCT Filed: Jul. 30, 1996

[86] PCT No.: PCT/JP96/02142

§ 371 Date: Jun. 16, 1997

§ 102(e) Date: Jun. 16, 1997

[87] PCT Pub. No.: WO97/05660

PCT Pub. Date: Feb. 13, 1997

[30] Foreign Application Priority Data

Aug. 2, 1995 [JP] Japan ................................. 7-197365

[51] Int. Cl.⁶ ........................... H01L 23/02; H01L 23/48; H01L 23/34
[52] U.S. Cl. ........................... 257/680; 257/686; 257/688; 257/689; 257/724; 257/725
[58] Field of Search .................................. 257/680, 686, 257/688, 689, 700, 724, 725

[56] References Cited

U.S. PATENT DOCUMENTS 5,327,325 7/1994 Nicewarner, Jr. ..................... 361/760
5,357,056 10/1994 Nagano ............................... 174/52.4
5,753,857 5/1998 Choi ................................. 174/52.4

FOREIGN PATENT DOCUMENTS

| | | |
|---|---|---|
| 52-13891 | 3/1977 | Japan . |
| 62-126665 | 6/1987 | Japan . |
| 62-205649 | 9/1987 | Japan . |
| 63-86460 | 4/1988 | Japan . |
| 1-95553 | 4/1989 | Japan . |
| 4-235476 | 8/1992 | Japan . |
| 7-45803 | 2/1995 | Japan . |
| 7-99214 | 4/1995 | Japan . |

*Primary Examiner*—Ngân V. Ngô
*Attorney, Agent, or Firm*—McDermott, Will & Emery

[57] ABSTRACT

A lead frame 24 comprising an inner lead 22 and outer lead 23 is sealingly filled from a through-hole into a package 21. A CCD chip 27 is inserted from an inlet 26 into the package 21. An electrode pad 28 is connected to the inner lead 22 via a bump 29 to complete an optical positioning and an electrical connection, then the positions of these components are fixed by glue. As a result, a solid-state image sensing apparatus can be manufactured at a low cost, and an accurate positioning can be realized. Thus, the solid-state image sensing apparatus can be employed to a video camera of high quality picture to reproduce vivid colors and fine pictures.

16 Claims, 6 Drawing Sheets

SOLID-STATE IMAGE SENSING APPARATUS AND MANUFACTURING METHOD THEREOF

FIELD OF ENGINEERING

The present invention relates to a solid-state image sensing apparatus using a solid-state image sensing device (hereinafter called CCD chip) in a package made of plastic, ceramic or glass(hereinafter called package), more particularly to a solid-state image sensing apparatus using three CCD chips, which is used for a video camera and required severe optical positioning accuracy. The present invention also relates to the manufacturing method of the solid-state image sensing apparatus.

BACKGROUND OF ENGINEERING

Recently, a video camera, a home-use video camera among others, has been equipped with the better functions in addition to its reducing size and weight. Consumers have demanded the better quality picture such as of high color fidelity as well as displaying detail. In order to satisfy this demand, technical levels relating to many components of the video camera have been highly enhanced, and in particular, performance of the CCD chip which is called "a heart of video camera," has been remarkably progressed in increasing a number of pixels. On the other hand, a home-use video camera of which main stream has been one-eye video camera using one CCD chip, starts replacing the one-eye with a three-eye using three CCD chips which has been employed in an expensive professional video camera, namely, three CCD chips correspond to Red, Green, Blue colors. Comparing with the one-eye video camera, the three-eye video camera is required an ultra positioning accuracy because three CCD chips are to be optically disposed at correct positions. Since the home-use video camera has been designed to be portable and smaller in size, many of the components are mounted in an extreme high density. Therefore, the solid-state image sensing apparatus for the home-use video camera is required to change itself in its own structure.

FIG. 9 and FIG. 10 depict a conventional solid-state image sensing apparatus. FIG. 9 is a cross section of a solid-state image sensing apparatus in a ceramic package which was once a mainstream. A ceramic package 1, on which metallized conductor 2 is formed, has a concave part 3 in the center thereof. On the concave part 3, a CCD chip 4 is mounted by die bonding, and an electrode pad 6 of CCD chip 4 is wire-bonded to the metallized conductor 2 by a metal lead 7. A lead terminal 8 is deposited to an end face of metallized conductor 2 exposing itself from the side of ceramic package 1.

FIG. 10 is a cross section of a solid-state image sensing apparatus in a plastic package. A lead frame 11 comprising an inner lead 9 and an outer lead 10 is inmolded in a plastic package 12. At a center of the plastic package, a concave portion 13 is situated. The CCD chip 4 is di-bonded by conductive paste 14 to the concave portion 13, and the electrode pad 6 on the CCD chip 4 is wire-bonded to the inner lead 9 by the metal lead 7 as same as the case of the ceramic package shown in FIG. 9.

However, according to the above conventional solid-state image sensing apparatus and the manufacturing method thereof, the CCD chip in either the ceramic package 1 or plastic package 12, is mounted on the base of either concave part 3 or 13 by die bonding. When this conventional solid-state image sensing apparatus having the above structure is mounted to the three-eye video camera and is accurately positioned in optical manner, the base of concave part 3 or 13 of ceramic package 1 or plastic package 12 to which the CCD chip 4 is die-bonded should be processed in high accuracy. Also a level of parallelism with regard to the base and an upper face of ceramic package 1 or plastic package 12 should be highly accurate. These factors not only increase a cost of ceramic package 1 or plastic package 12 but also raise a cost of mounting process of CCD chip 4. The wire-bonding method for connecting the electrode pad 6 of CCD chip 4 with the metallized conductor 2 or the inner lead 9 via the metal lead 7 is a classic manufacturing technique expecting a low defect ratio and requiring little effort for replacing chips; however, this method limits the size reduction of solid-state image sensing apparatus, and cannot fully respond to a request of reducing a size thereof from the market of home-use video camera.

DISCLOSURE OF THE INVENTION

The present invention aims to provide a solid-state image sensing apparatus mountable to a video camera of high quality picture, which not only can reproduce vivid colors and fine pictures but also can be manufactured at a low cost. The present invention also aims to provide a manufacturing method of the solid-state image sensing apparatus.

The solid-state image sensing apparatus according to the present invention comprises a package having a through hole therein, a lead frame comprising an inner lead and an outer lead sealed therein, and a CCD chip loaded therein. Both the end faces of the package have different opening areas. The CCD chip can be mounted from the opening having the wider opening area, and thereby shutting the through hole tightly.

Another type of the solid-state image sensing apparatus according to the present invention has the opening of the package. The electrode pad of CCD chip is connected via the inner lead to the opening, and the opening area is smaller than the entire area of CCD chip.

Still another type of the solid-state image sensing apparatus according to the present invention has the package having a through hole therein, and the lead frame comprising the inner lead and outer lead sealed therein, and a substrate on which the CCD chip and peripheral circuit elements are mounted being loaded into the package from the opening which has the wider opening area, and the electrode pad of substrate connected to the inner lead exposed from a periphery of end face of the opening which has the smaller opening area.

Further another type of the solid-state image sensing apparatus of the present invention has the package having a through hole therein, and the lead frame comprising the inner lead and outer lead sealed therein, and the peripheral circuit elements mounted on a substrate which is disposed on an upper surface of the substrate excluding the surface where the CCD chip is mounted. The two substrates are loaded into the package from the opening which has the wider opening area. The electrode pad is connected to the inner lead exposed from the periphery end face of the opening which has the smaller opening area.

Another type of the solid-state image sensing apparatus of the present invention has the package having the through hole therein, and the lead frame comprising the inner lead and outer lead sealed therein, and the CCD chip fixed and coupled to a first inner lead exposed from a first step of the package, and the peripheral circuit elements fixed and connected to a second inner lead exposed from a second step of the package.

A manufacturing method according to the present invention relates to the solid-state image sensing apparatus which has the package comprising a through hole therein, and the lead frame comprising the inner lead and outer lead sealed therein, and the CCD chip mounted therein. The CCD chip is loaded into the through hole of the package from the opening which has the wider opening area. The electrode pad of solid-state image sensing apparatus is coupled to the inner lead via a bump or an anisotropic conductor having only vertical conductivity so that optical positioning as well as electrical connecting is completed. Then a back side of the CCD chip is glued to the package by adhesive.

Another manufacturing method according to the present invention relates to the solid-state image sensing apparatus which has the package comprising the through hole therein, and the lead frame comprising the inner lead and outer lead sealed therein, and the CCD chip as well as the peripheral circuit elements mounted therein. The CCD chip and group of wirings are formed on a semi-conductor substrate, then the periphery circuit elements are disposed on the substrate excluding a preoccupied place by the CCD chip, and connected to the group of wirings. Next, the substrate is loaded into the through hole from the opening which has the wider opening area. The electrode pad disposed around the upper surface of the substrate is connected to the inner lead via the bump or anisotropic conductor so that the optical positioning as well as electrical connection is completed. Then the back side of the substrate having the CCD chip and peripheral circuit elements thereon is glued to the package by adhesive.

Still another manufacturing method according to the present invention relates to the solid-state image sensing apparatus which has the package comprising the through hole therein, and the lead frame comprising the inner lead and outer lead sealingly filled therein, and the CCD chip as well as the peripheral circuit elements loaded therein. The CCD chip and the peripheral circuit elements are mounted on the substrate where the group of wirings were already disposed, and the CCD chip and the peripheral circuit elements are connected to the group of wirings. The substrate is loaded into the through hole from the opening which has the wider opening area. The electrode pad disposed at periphery of the upper surface of the substrate is connected to the inner lead via the bump or anisotropic conductor so that the optical positioning as well as electrical connection is completed. Then the back side of the substrate having the CCD chip and peripheral circuit elements thereon is glued to the package by adhesive.

Further another manufacturing method according to the present invention relates to the solid-state image sensing apparatus which has the package comprising the through hole therein, and the lead frame comprising the inner and outer leads sealed therein, and the CCD chip as well as the peripheral circuit elements mounted therein. The CCD chip is loaded into the through hole of the package from the opening which has the wider opening area, and the electrode pad is connected to the first inner lead via the bump or the anisotropic conductor so that optical positioning as well as electrical connection is completed. Then the back side of the CCD chip is glued to the package by adhesive, and the peripheral circuit elements is loaded into the through hole from the same opening used when the CCD chip loaded. The electrode pad of the peripheral circuit elements is electrically connected to the second inner lead via the bump or the anisotropic conductor, and then the back side of the peripheral circuit elements is glued to the package by adhesive.

According to the present invention, the through hole is provided in the package, and the CCD chip can be loaded into the package from the bottom side, namely from the opening which has the wider opening area. The electrode pad of CCD chip is electrically connected to the bump or the anisotropic conductor, and also optically positioned at the same time. Thus, the present invention can reduce a number of manufacturing processes comparing with the conventional method which requires two bonding processes including the die-bonding of CCD chip and the wire-bonding of electrode pad. Further, because a loading jig for the CCD chip can be disposed at the back side of CCD chip, the CCD chip can be optically positioned with ease from the front, thus more accurate positioning can be expected.

THE DESCRIPTION OF PREFERRED EMBODIMENT

Figure 1:
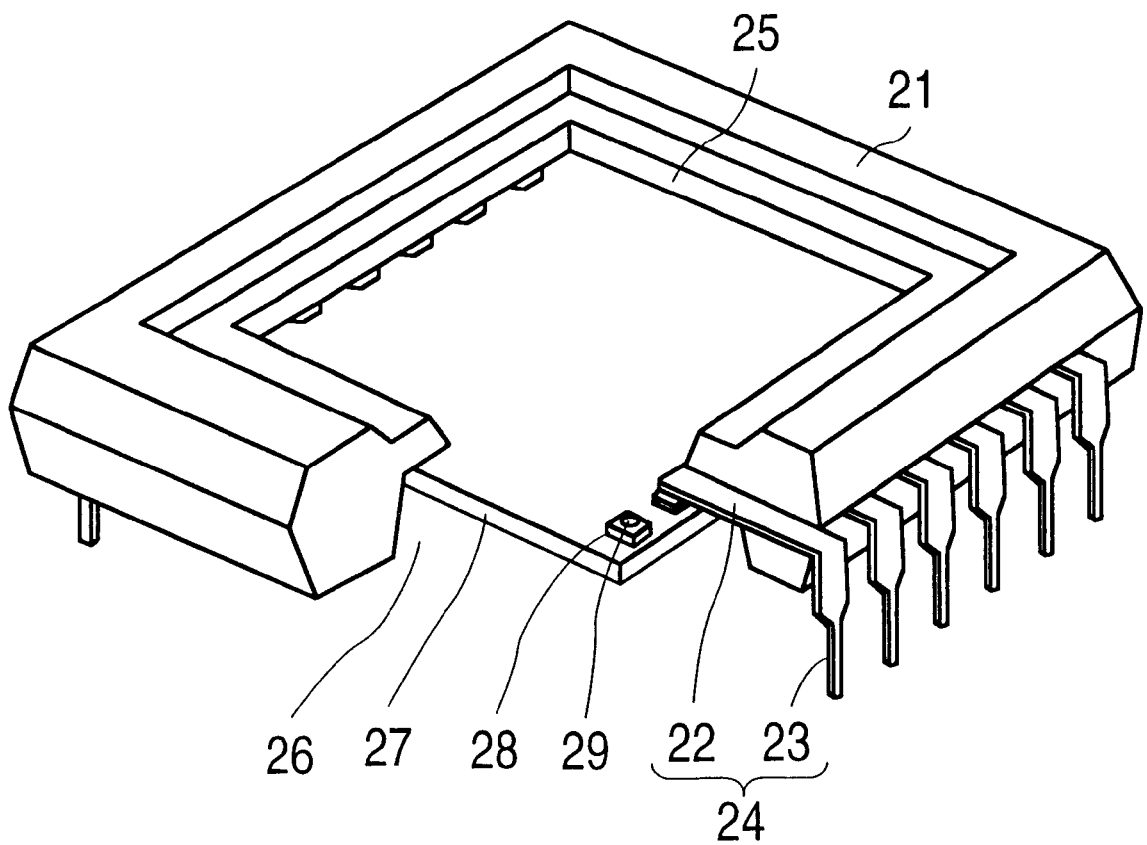
FIG. 1 is a cutaway perspective view of the solid-state image sensing apparatus of an exemplary embodiment of the present invention.

An exemplary embodiment of the present invention is stated here by referring to FIG. 1, which is a cutaway perspective view of an exemplary embodiment according to the present invention. A lead frame 24 comprising an inner lead 22 and an outer lead 23 is inmolded in a package 21. As FIG. 1 depicts, a through hole is provided at the center of the package 21, and in front side of the package 21, an opening 25 which has a smaller opening area is situated, and another opening 26 (hereinafter called "inlet" which has a wider opening area is situated at the back side thereof. The area of opening 25 is smaller than that of CCD chip 27. An inner lead 22 is exposed from the back side of a step between the opening 25 and the inlet 26, and the inner lead 22 is electrically connected to a bump 29 disposed on an electrode 28 of CCD chip 27.

Figure 2:
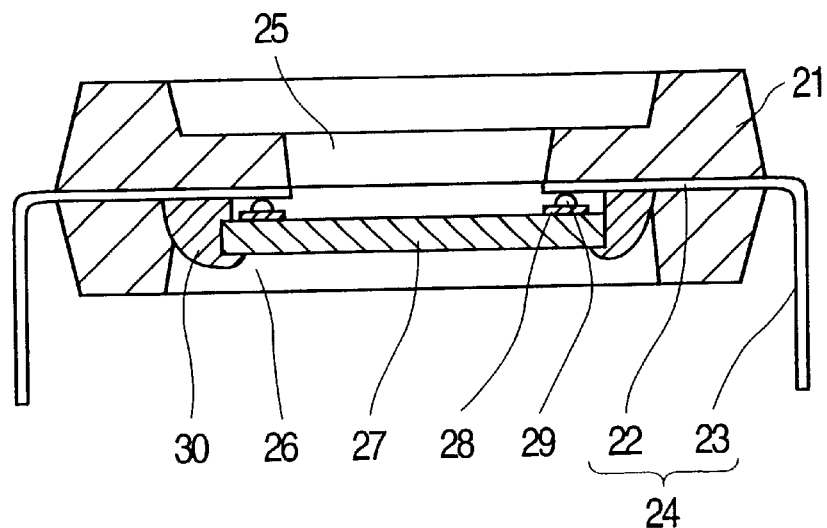
FIG. 2 is a cross section of the solid-state image sensing apparatus of the first exemplary embodiment of the present invention.

Next, a manufacturing method according to the present invention is described. FIG. 2 is a cross section of the solid-state image sensing apparatus according to the first exemplary embodiment of the present invention. Epoxy resin mixed with inorganic filler is injected into a mold where the lead frame 24 made of phosphor bronze, etc. is disposed, and is inmolded at a high temperature. Then the package 21 is taken out from the mold. A frame body of the lead frame 24 is cut away, and the outer lead 23 is bent toward the inlet 26, thereby forming the package 21. The bump 29 is formed on the electrode pad 28 of the CCD chip 27, whose back side is held by a mounting jig(not shown), and the CCD chip 27 is inserted into the package 21 from the net 26. Then, the bump 29 is press-fitted and connected to the inner lead 22 which is exposed from a back side of the step situated between the opening 25 and the net 26. During this press-fit operation, a position signal is feedbacked from a optical position adjusting device(not shown) disposed in front of the CCD chip 27 to the mounting jig, thereby finely adjusting an orientation of the CCD chip 27 and disposing the CCD chip 27 on the back side of the step of the package 21. At the same time, ultra-violet hardening adhesive 30 is injected in a specified quantity from a dispenser which is situated beside a press-fit jig to glue four sides of the CCD chip 27 to the package 21, and finally, the CCD chip 27 is accurately mounted to the package 21.

Figure 3:
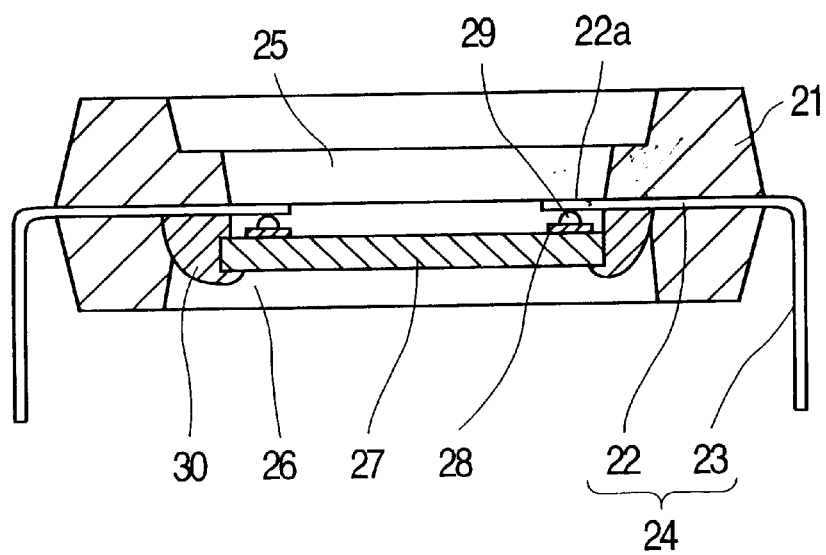
FIG. 3 is a cross section of the solid-state image sensing apparatus of the second exemplary embodiment of the present invention.

FIG. 3 is a cross section of the solid-state image sensing apparatus used in a second exemplary embodiment of the present invention. A different point from the first exemplary embodiment is this: a tip 22a of the inner lead 22 slightly protrudes from the opening 25 toward inside. This structure facilitates the optical positioning as well as the bonding between the inner lead and the bump 29 thanks to elasticity of the tip 22a.

In the first and second exemplary embodiments, the bump 29 is disposed on the electrode pad 28; however, the bump 29 may be disposed at the tip of inner lead 22 and coupled with the electrode pad 28 of CCD chip 27.

Figure 4:
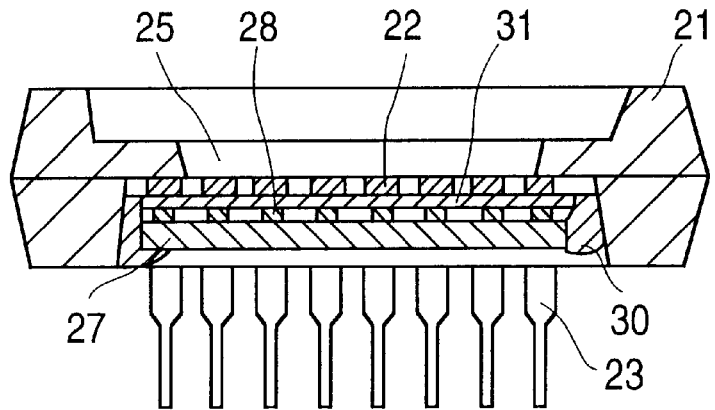
FIG. 4 is a cross section of the solid-state image sensing apparatus of the third exemplary embodiment of the present invention.

FIG. 4 is a cross section of the solid-state image sensing apparatus used in Embodiment 3. The inner leads 22 are cut so that they seem to be arranged in parallel from their cross sectional view. In this embodiment, the electrode pad 28 of CCD chip 27 and the inner leads 22 are connected via the anisotropic conductor 31 which has conductivity in only the vertical direction instead of via the bump 29. Thanks to the elasticity of anisotropic conductor 31 made of conductive rubber or the like, the CCD chip 27 can be optically positioned with ease as same as the second embodiment.

According to this exemplary embodiment, an assembly process can be substantially simplified because of the structure as follows: the through hole is provided in the package 21, and the CCD chip 27 is loaded from the inlet 26 which is situated on the back side of package 21, namely, on the side of outer leads, and the exposed inner lead 22 from the back side of the step situated between the opening 25 and the inlet 26 is connected to the electrode pad 28 of CCD chip 27 electrically via the bump or anisotropic conductor, at the same time, an optical positioning between the inner lead 22 and the electrode pad 28 is completed. Further, since the mounting jig of CCD chip 27 can be disposed on the back side of CCD chip 27, the CCD chip 27 can be optically positioned from the front with ease, thus an accurate positioning can be achieved.

Figure 5:
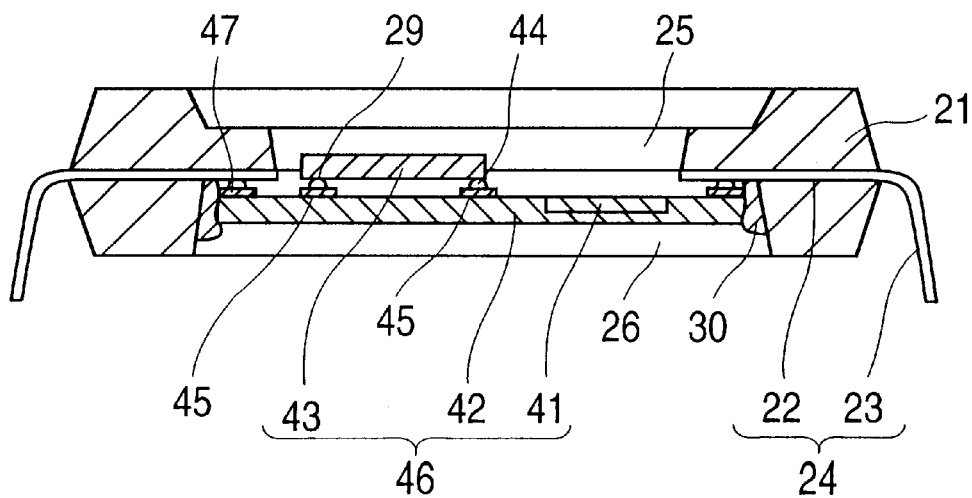
FIG. 5 is a cross section of the solid-state image sensing apparatus of the fourth exemplary embodiment of the present invention.

FIG. 5 is a cross section of the solid-state image sensing apparatus used in Embodiment 4. Epoxy resin mixed with inorganic filler is injected into a mold where the lead frame 24 made of phosphor bronze, etc. are disposed, and is inmolded at a high temperature. Then the package 21 is taken out from the mold. A frame body of the lead frame 24 is cut away, and the outer lead 23 is bent toward the inlet 26, thereby forming the package 21. A substrate 42 comprising a semiconductor substrate such as silicon wafer, on which a group of wirings (not shown) and a CCD chip 41 are formed, and on a part of the substrate surface, a peripheral circuit elements 43 are disposed in a face-down way; the peripheral circuit elements 43 were produced in a separate manufacturing process. A bump 29 disposed on an electrode pad 44 of the peripheral circuit elements is connected to an electrode pad 45 of the group of wirings on the substrate 42, thereby producing a function device 46 (hereinafter called "CCD module"). A back side of the CCD module 46 is held by a mounting jig (not shown), and is inserted from the inlet 26 into the package 21. Then, the bump 29 on an electrode pad 47 disposed around the CCD module 46 is press-fitted to the inner lead 22 exposed from the back side of the step situated between the opening 25 and the inlet 26, thus the bump 29 is electrically connected with the inner lead 22.. During this press-fit operation, a position signal is feedbacked from an optical position adjusting device(not shown) disposed in front of the CCD chip 41 to the mounting jig, thereby finely adjusting an orientation of the CCD chip 41 and disposing the CCD module 46 on the back side of the step of the package 21. At the same time, ultra-violet hardening adhesive 30 is injected in a specified quantity from a dispenser which is situated beside a press-fit jig to glue four sides of the CCD chip 41 to the package 21, and finally, the CCD chip 41 is accurately mounted to the package 21.

Figure 6:
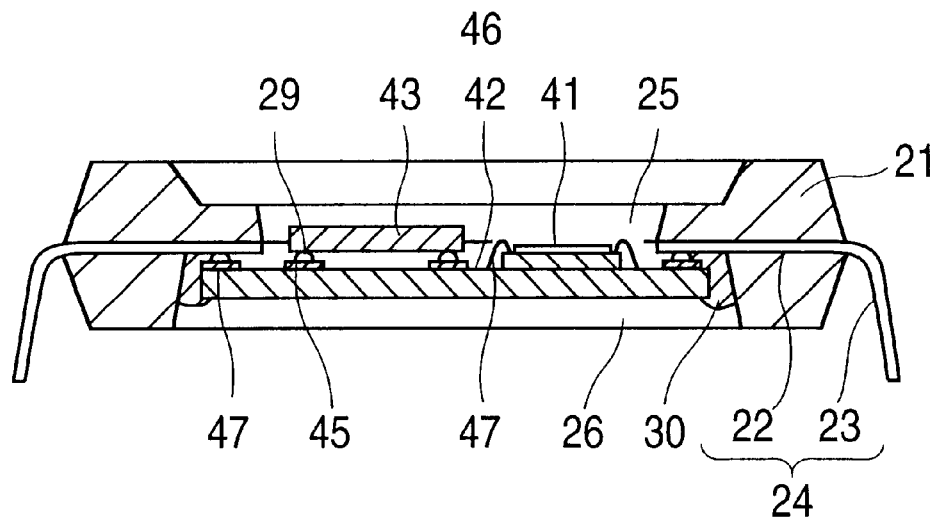
FIG. 6 is a cross section of the solid-state image sensing apparatus of the exemplary embodiment of the present invention.

FIG. 6 is a cross section of the solid-state image sensing apparatus used in Embodiment 5 of the present invention. This embodiment is one of variations of Embodiment 4 described above. The method of accurately mounting the CCD chip 41 to the package 21 is the same as that of the Embodiment 4 from the standpoints of structure and manufacturing, namely, the CCD module 46 on which the CCD chip, peripheral circuit elements and the group of wirings are formed, is inserted from the inlet 26, and the CCD module 46 is fixed to the package 21, while the optical position of CCD chip 41 is fine adjusted. A different point from the Embodiment 4 is this: in Embodiment 4, the CCD chip is formed directly on the semiconductor substrate, which is to be the substrate 42 of the CCD module 46, through a circuit-chip-forming-process such as a direct diffusion process, on the other hand in Embodiment 5, the CCD chip 41 as well as peripheral circuit elements 43 was already produced in a separate process, and the CCD chip 41 and peripheral circuit elements 43 are disposed on the substrate 42 on which the group of wirings have been formed, and thereby they are electrically connected to form the CCD module 46.

Accordingly, the substrate 42 used in this embodiment may be made of a material other than semiconductor. As shown in FIG. 6, when the CCD chip 41 produced in the separate process is mounted on the substrate 42, the electrode of CCD chip 41 is wire-bonded to the electrode terminal of the group of wirings by using a metal wire 47a.

Figure 7:
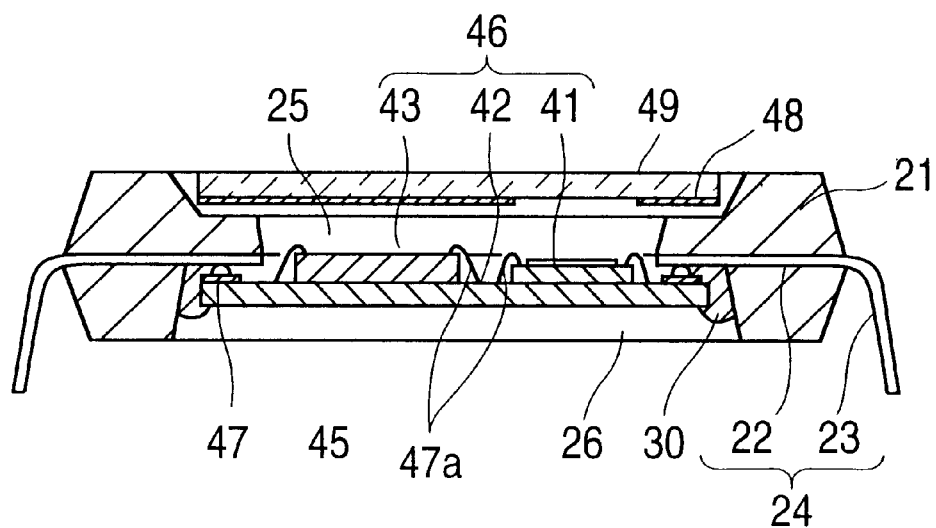
FIG. 7 is a cross section of the solid-state image sensing apparatus of the sixth exemplary embodiment of the present invention.

FIG. 7 is a cross section of the solid-state image sensing apparatus used in Embodiment 6. This embodiment is also one of variations of Embodiment 5 above mentioned. A different point from Embodiment 5 is this: in Embodiment 5, the peripheral circuit elements 43 are connected to the substrate 42 via the bump 29 in the face-down way same as that in Embodiment 4; however, in this Embodiment 6, the peripheral circuit elements 43 are disposed on the substrate 42 in the face-up way(the face on which a circuit is formed is situated upward) as the CCD chip 41 is in Embodiment 5, and the electrode of peripheral circuit elements is wire-bonded to the electrode terminal of the group of wiring by using the metal wire 47*a*.

Embodiments 4, 5, and 6 have some similarities as well as differences with each other. An advantage of the solid-state image sensing apparatus in these embodiments are as follows.

First, in Embodiment 4, since the CCD chip 41 is formed on the substrate 42 together with other groups of wirings at the same time, the electrode of CCD chip 41 is electrically connected to the electrode terminals of the groups of wirings with ease and reliably. Therefore, Embodiment 4 is effective for reducing the size of the solid-state image sensing apparatus.

Second, in Embodiment 5, since the CCD chip, which has a large number of pixels to be highly accurate and, as a result, an yield ratio generally has to be extraordinarily low, is produced in the separate process, only defect-free CCD chips are put into the assembly process, thereby reducing the total cost.

Third, in Embodiment 6, the electrodes of CCD chip 41 and peripheral circuit elements 43 are connected to the electrode terminal of group of wirings by mounting technique or wire-bonding method, both are classic techniques and have high reliability based on ample experience of mounting engineering and automatic mounting machines. Since the surface on which the circuit elements 43 are formed is situated upward, a shading film 48 is required; however, when defects are found in the CCD chip 41 or the peripheral circuit elements 43, the defective parts can be easily replaced and the other parts also can be used again. In FIG. 7, a glass substrate 49 is made from the shading film by being deposited with metal or by sputtering.

As described above, the solid-state image sensing apparatus in Embodiments 4, 5, or 6 is used depending on a requested performance, price, and application.

Figure 8:
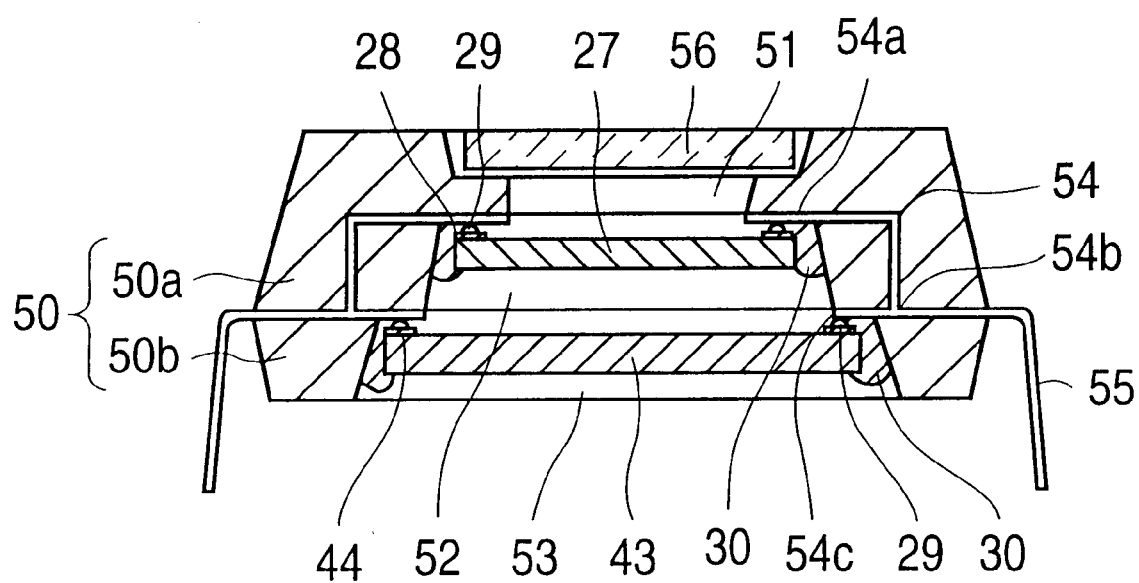
FIG. 8 is a cross section of the solid-state image sensing apparatus of the seventh exemplary embodiment of the present invention.
Figure 9:
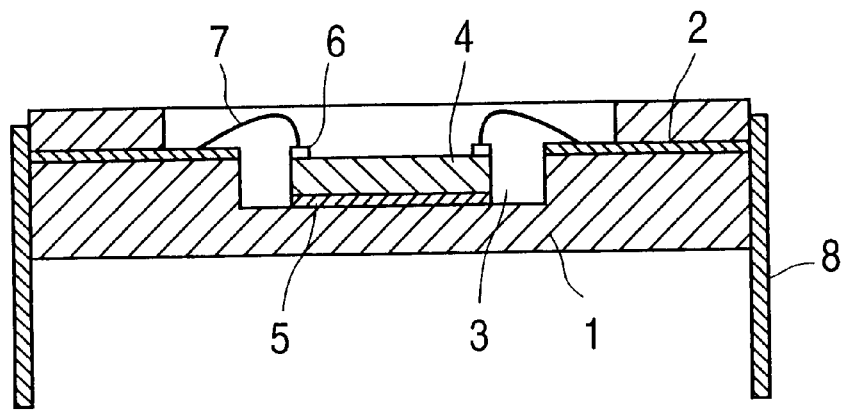
FIG. 9 is a cross section of a conventional solid-state image sensing apparatus.
Figure 10:
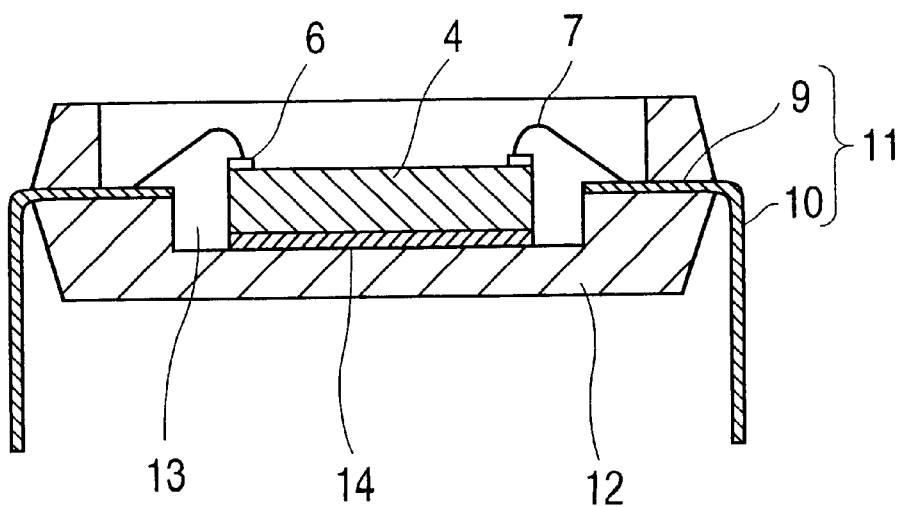
FIG. 10 is a cross section of another conventional solid-state image sensing apparatus.

FIG. 8 is a cross section of the solid-state image sensing apparatus used in Embodiment 7. A different point from the above embodiments is this: the CCD chip and peripheral circuit elements are mounted in multilayered structure situated in the package, therefore, the package structure of this embodiment is different from those of the above embodiments, namely, the CCD chip and peripheral circuit elements are inserted into the package from the through hole comprising two openings both having wide and different opening areas.

A structure and manufacturing method of Embodiment 7 is described as follows. In FIG. 8, a package 50 having an original structure is employed in Embodiment 7. A first opening 51 having a small opening area is disposed on a first end face, a second opening 52 having a large opening area and a third opening 53 having the larger opening area than that of the opening 52 are disposed on a second end face. Regarding a package 50, its upper frame 50*a* has the first opening 51 and the second opening 52, and also has a bent inner lead 54 situated therein. A first end of the inner lead 54 forms an exposed terminal 54*a* of the inner lead from a step situated between the first opening 51 and second opening 52. A second terminal 54*b* of inner lead 54 bent and extended downward from inside of the upper frame 50*a* is sealed between a lower frame 50*b* and the upper frame 50*a*, and the end of the terminal 54*b* is connected in the package to a junction point of an inner lead terminal 54*c* exposed from a step between the second opening 52 and third opening 53 with an outer lead 55 which is bent outside of the package 50.

The manufacturing method shown in FIG. 8 is, first, as same as the Embodiment 1, the epoxy resin mixed with inorganic filler is injected into a mold where the lead frame comprising the inner lead 54 made of phosphor bronze, etc. and the outer lead 55 is disposed, and is inmolded at a high temperature. Then the package 50 is taken out from the mold. A frame body of the lead frame is cut away, and the outer lead 55 is bent toward the inlet 26, thereby forming the package 50. The bump 29 is formed on the electrode pad 28 of the CCD chip 27, whose back side is held by a mounting jig(not shown), and the CCD chip 27 is inserted into the package 50. Then, the bump 29 is press-fitted and connected to the inner lead terminal 54*a* which is disposed at a first step situated on the upper frame of the package 50. During this press-fit operation, a position signal is feedbacked from an optical position adjusting device(not shown) disposed in front of the CCD chip 27 to the mounting jig, thereby an orientation of the CCD chip 27 is finely adjusted and the CCD chip 27 is positioned at the back side of the step of the package 50. At the same time, ultra-violet hardening adhesive 30 is injected in a specified quantity from a dispenser which is situated beside a press-fit jig to glue four sides of the CCD chip 27 to the package 50, and finally, the CCD chip 27 is accurately mounted to the package 50.

Then, the peripheral circuit elements 43 are also inserted into the lower frame 50*b* of package 50 from the third opening 53, and the electrode pad 44 of peripheral circuit elements 43 are connected via the bump 29 by press-fit to the second inner lead terminal 54*c* which is exposed from the step between the second opening 52 and third opening 53. At the same time, ultra-violet hardening adhesive 30 is injected in a specified quantity from a dispenser which is situated beside a press-fit jig to glue four sides of the peripheral circuit elements 43 to the package 50, and finally, the peripheral circuit elements 43 are accurately mounted to the package 50.

Thus, according to Embodiment 7, the CCD chip 27 and peripheral circuit elements 43 are disposed in multilayerd or vertical structure within the package 50, and the driving circuit can be incorporated into the solid-state image sensing apparatus, thereby reducing an area occupied by parts mounted on the substrate. As a result, a high density mounting into a small size video camera can be realized.

A protection panel 56, made of transparent material such as glass, is shown in FIG. 8. The protection panel 56 protects the inside of solid-state image sensing apparatus; however, whether using of this protection panel 56 or not does not change the functions as well as effects of the present invention described in the above embodiments.

In Embodiment 5 through Embodiment 7, the tip of inner lead can be slightly protruded from the opening toward inside of package, as described in Embodiment 3. Thus, the optical positioning and bonding with the bump can be completed with ease thanks to the elasticity of the inner lead tip. Further, in the above Embodiments 1 and 2, the case is described that the bump 29 is disposed on the electrode pad 28 of CCD chip 27; however, the bump 29 can be disposed at the tip of inner lead 22 and connected with the electrode pad 47 of CCD module 46.

In Embodiment 5 through Embodiment 7, the electrode pad 47 of CCD module 46 can be connected to the inner lead terminal via, instead of the bump 29, the anisotropic conductor which has only vertical conductivity, as described in Embodiment 4.

Industrial Applicability

According to the above solid-state image sensing apparatus and the manufacturing method thereof of the present invention, the invention relates to the solid-state image sensing apparatus comprising a through hole therein, the lead frame comprising the inner and outer leads which are sealed in the package, and the CCD chip as well as peripheral circuit elements mounted in the package, and also relates to the manufacturing method of the same. The package has the openings on both end faces, and the areas of the openings differ with each other. The CCD chip is inserted from the larger opening into the package, thereby sealing the through hole. Since the electrode pads of CCD chip and that of the peripheral circuit elements are connected to the inner leads via the anisotropic conductor, a number of manufacturing processes can be greatly reduced. Further, the mounting jig of CCD chip is disposed behind the CCD chip and the CCD chip is optically positioned from the font, thus highly accurate positioning can be achieved. As a result, the solid-state image sensing apparatus, which enables a video camera to reproduce vivid colors as well as fine pictures, can be manufactured at a low cost.

What is claimed is:

1. A solid-state image sensing apparatus comprising:
    a package having a through hole therein, openings on both end faces thereof, and different opening areas of said openings,
    a lead frame comprising inner leads and outer leads, said lead frame being sealed in said package, and
    a solid-state image sensing device mounted in said package by being inserted from an inlet of said opening which has a wider area, and thereby sealing said through hole, said solid-state image sensing device being secured to said package via an adhesive.

2. A solid-state image apparatus comprising:
    a package comprising a main body having a through hole therein, said main body having a top surface and a bottom surface, said package further comprising a ledge formed on said main body so as to extend inwardly toward the center of said through hole, said ledge comprising an upper surface and a lower surface;
    a lead frame comprising inner leads and outer leads, said lead frame being sealed in said package such that said inner leads extend inwardly from said main body so as to be adjacent said lower surface of said ledge; and
    a solid-state image sensing device having an upper surface and a lower surface and a plurality of electrode pads disposed on said upper surface, each of said plurality of electrode pads coupled to one of said inner leads;
    said solid-state image sensing device being secured to said main body of said package via an adhesive.

3. The solid-state image sensing apparatus of claim 2, wherein each of the electrode pads is connected to the inner lead via a bump.

4. The solid-state image sensing apparatus of claim 2, wherein each of the electrode pads is connected to the inner lead via an anisotropic conductor having only vertical conductivity.

5. The solid-state image sensing apparatus of claim 2, wherein a tip of the inner lead to which the electrode pad is connected extends beyond said ledge.

6. A solid-state image sensing apparatus comprising:
    a package having a through hole therein, openings on both end faces thereof, and different opening areas of said openings,
    a lead frame comprising inner leads and outer leads, said lead frame being sealed in said package,
    a substrate on which a solid-state image sensing device and a peripheral circuit chip are mounted being inserted into the package from a wider opening thereof, and
    an electrode pad of said substrate being connected to said inner lead exposed from around a smaller opening of said package,
    said substrate being secured to said package via an adhesive.

7. A solid-state image sensing apparatus comprising:
    a package having a through hole therein, openings on both end faces thereof, and different opening areas of said openings,
    a lead frame comprising inner leads and outer leads, said lead frame being sealed in said package,
    a semiconductor substrate having a solid-state image sensing device and a peripheral circuit chip disposed on an upper surface thereof, said semiconductor substrate being inserted into a plastic package via the larger of two openings formed in said package, and
    an electrode pad of said semiconductor substrate being connected to the inner lead exposed from around the smaller opening of said package,
    said semiconductor substrate being secured to said package via an adhesive.

8. The solid state image sensing apparatus of claim 6 or claim 7, wherein a shading film covers an entire upper surface of said substrate except an upper surface of the solid-state image sensing device.

9. The solid-state image sensing apparatus of claim 6 or claim 7, wherein an electrode pad formed on the substrate is connected to the inner lead via a bump.

10. The solid-state image sensing apparatus of claim 6 or claim 7, wherein an electrode pad formed on the substrate is connected to the inner lead via an anisotropic conductor which has only vertical conductivity.

11. The solid-state image sensing apparatus of claim 6 or claim 7, wherein an electrode pad formed on the substrate is connected to the inner lead at an outer portion of said lead, said outer portion of said lead extending into the openings of the package.

12. A solid-state image sensing apparatus comprising:
    a package having a through hole therein, openings on both end faces thereof, and different opening areas of said openings,
    a lead frame comprising inner leads and outer leads, said lead frame being sealed in said package, and
    a solid-state image sensing device and a peripheral circuit chip both mounted in said package, said solid-state image sensing device being connected to a first inner lead exposed beneath a first step surface formed in said package, said solid-state image sensing device being secured to said package via an adhesive, and said peripheral circuit chip being connected to a second inner lead exposed beneath a second step surface formed in said package, said peripheral circuit chip being secured to said package via an adhesive.

13. A manufacturing method of a solid-state image sensing apparatus comprising a package having a through hole therein, a lead frame comprising inner leads and outer leads, said lead frame being sealed in said package, and a solid-state image sensing device mounted in said package, said manufacturing method comprising the steps of:
    inserting said solid-state image sensing device into said through hole,
    connecting an electrode pad of the solid-state image sensing device inserted in the through hole to the inner lead via a bump or an anisotropic conductor having only vertical conductivity, while simultaneously adjusting the optical positioning of said solid-state image sensing device, and securing said solid-state image sensing device to the package with an adhesive.

14. A manufacturing method of a solid-state image sensing apparatus comprising a package having a through hole therein, a lead frame comprising inner leads and outer leads, said lead frame being sealed in said package, and a solid-state image sensing device as well as a peripheral circuit chip mounted in said package, said manufacturing method comprising the steps of:

forming said solid-state image sensing device and a group of wirings on a semiconductor substrate, mounting said peripheral circuit chip on the solid-state image sensing device to connect with said group of said semiconductor surface, inserting said semiconductor substrate into the through hole, connecting an electrode pad disposed on the semiconductor substrate to the inner lead via a bump or an anisotropic conductor having only vertical conductivity, while simultaneously adjusting the optical positioning of said solid-state image sensing device, and securing the semiconductor substrate on which the solid-state image sensing device and the peripheral circuit chip are mounted to the package via an adhesive.

15. A manufacturing method of a solid-state image sensing apparatus comprising a package having a through hole therein, a lead frame comprising inner leads and outer leads, said lead frame being sealed in said package, and a solid-state image sensing device as well as a peripheral circuit chip mounted in said package, said manufacturing method comprising steps of:

mounting said solid-state image sensing device and said peripheral circuit chip on a substrate where a group of wirings is disposed in order to connect the solid-state image sensing device and the peripheral circuit chip to the group of wirings, inserting the semiconductor substrate into the through hole, connecting an electrode pad disposed on a periphery of the substrate to the inner lead via a bump or an anisotropic conductor having only vertical conductivity, while simultaneously adjusting the optical positioning of the solid-state image sensing device, and securing the semiconductor substrate on which said solid-state image sensing device and said peripheral circuit chip are mounted to the package via an adhesive.

16. A manufacturing method of a solid-state image sensing apparatus comprising a package having a through hole therein, a lead frame comprising inner leads and outer leads, said lead frame being sealed in the package, and a solid-state image sensing device as well as a peripheral circuit chip mounted in said package, said manufacturing method comprising steps of:

inserting said solid-state image sensing device into the through hole, connecting an electrode pad of the solid-state image sensing device to a first inner lead via a bump or an anisotropic conductor having only vertical conductivity, while simultaneously adjusting the optical positioning of the solid-state image sensing device, said first inner lead being disposed beneath a first step surface formed in said package, securing the solid-state image sensing device to the package via an adhesive, inserting the peripheral circuit chip into the through hole, connecting an electrode pad of the peripheral circuit chip to a second inner lead via a bump or an anisotropic conductor having only vertical conductivity, to complete an electrical connection, said second inner lead being disposed beneath a second step surface formed in said package, and securing the peripheral circuit chip to the package via an adhesive.

* * * * *

UNITED STATES PATENT AND TRADEMARK OFFICE
CERTIFICATE OF CORRECTION

PATENT NO. : 5,952,714
DATED : September 14, 1999
INVENTOR(S) : Sano et al.

It is certified that error appears in the above-identified patent and that said Letters Patent is hereby corrected as shown below:

On the cover page:

At the end of the "FOREIGN PATENT DOCUMENTS" section, insert:

--63-274162  11/88  Japan--.

Signed and Sealed this

Fifth Day of September, 2000

Attest:

Q. TODD DICKINSON

*Attesting Officer*    *Director of Patents and Trademarks*